United States Patent [19]

Talbot

[11] Patent Number: 4,485,359
[45] Date of Patent: Nov. 27, 1984

[54] AMPLITUDE MODULATOR HAVING SUBSTANTIALLY ZERO MODULATION DISTORTION

[76] Inventor: Daniel B. Talbot, 1 Dean St., Hudson, Mass. 01749

[21] Appl. No.: 479,856

[22] Filed: Mar. 28, 1983

Related U.S. Application Data

[62] Division of Ser. No. 242,571, Mar. 11, 1981, Pat. No. 4,403,194.

[51] Int. Cl.³ .............................................. H03C 1/44
[52] U.S. Cl. ................................ 332/31 T; 332/37 D
[58] Field of Search ................. 332/31 R, 31 T, 37 R, 332/37 D; 455/108

[56] References Cited

U.S. PATENT DOCUMENTS 3,866,148  2/1975  Lisle, Jr. et al. .................. 332/31 T
3,974,460  8/1976  Hongu et al. ...................... 332/31 T

OTHER PUBLICATIONS

Blesser, "Ultralinear Transistor Configuration Under Conditions of Minimal Power-Supply Drain Current", IEEE Journal of Solid-State Circuits, vol. SC-5, No. 3, Jun. 1970, pp. 125-126.

Analog Devices, Inc., Nonlinear Circuits Handbook, 1974, pp. 222-223.

Primary Examiner—Siegfried H. Grimm
Attorney, Agent, or Firm—Schiller & Pandiscio

[57] ABSTRACT

An improved substantially "zero distortion" four quadrant modulator of the type including a pair of differential elements respectively coupled to the Y input port terminals of the modulator and exhibiting nonlinear amplitude transfer functions, includes the means for substantially linearizing the nonlinear transfer function. The means includes a pair of operational amplifiers, each having an input coupled to a respective terminal of the Y input port and an output coupled to the corresponding differential element so that the differential element is disposed in the feedback path of the operational amplifier.

12 Claims, 3 Drawing Figures

AMPLITUDE MODULATOR HAVING SUBSTANTIALLY ZERO MODULATION DISTORTION

This application is a Divisional of my copending application Ser. No. 242,571, filed Mar. 11, 1981, for MODULATOR AND DEMODULATOR, now U.S. Pat. No. 4,403,194 issued Sept. 6, 1983.

The present invention relates generally to signal modulation and demodulation, and more particularly to AM modulators and demodulators providing outputs exhibiting extremely low distortion.

Various AM signal modulators and demodulators are well known. One common modulator comprises a double-balanced mixer or multiplier and a high frequency signal summer. The multiplier receives two inputs, the modulation input or envelope signal having a predetermined message rate and the carrier signal, typically at a frequency much larger than the message rate of the modulation input. The output of the multiplier is a double-sideband suppressed carrier signal. A desired amplitude of unmodulated carrier is then added through a high frequency summer to the multiplier output to provide the desired standard AM signal. The advantage of this modulator is that the multiplier is typically operated about the zero amplitude axis or origin and therefore over a relatively small portion of its linear range so as to yield theoretically lower distortion. A disadvantage of this approach, however, is that unless the phase angle of the summing process is held exactly at either zero or 180 degrees, the linearity of the modulation envelope can be destroyed.

A second common modulator which avoids this phasing problem comprises a low frequency summer for adding the modulation input or envelope signal to a DC offset signal. The output of the summer, i.e., the message signal, is applied to a signal mixer where it is multiplied with the carrier signal to produce the standard AM signal. The DC offset signal sets the average carrier envelope amplitude, and the message signal swings this amplitude upwards or downwards by an amount equal to the modulation index, at a rate equal to the message rate. The arrangement avoids the problem of maintaining a particular phase relationship in the high frequency summer of the above-described modulator. However, since the modulation input to the modulator is driven by the algebraic sum of the envelope signal and a DC offset, the linear dynamic range of the multiplier may be occupied by the DC offset term setting the average carrier level. The result is of course distortion in the output.

Another modulator is the four-quadrant balanced transconductance multiplier. An example of such a multiplier is one manufactured in integrated circuit form as chip MC1496P by the Semiconductor Products Division of Motorola, Inc., doing business in Scottsdale, Ariz. This four-quadrant balanced modulator is the functional equivalent of a multiplier (or mixer). The modulator, described in greater detail hereinafter, includes two input terminals (referred to hereinafter as the "X" input port and sometimes known as the "toggle", "commutate" or "local oscillator" input) for receiving the continuous wave or carrier signal. The modulator also includes a second pair of input terminals (referred to hereinafter as the "Y" input port) adapted to receive the envelope or modulation input signal. Since the multiplier can accommodate both positive and negative polarity signals at each of its pair of input terminals the multiplier is characterized as a four-quadrant multiplier. The Y input terminals are respectively coupled to a pair of differential elements in the form of transistors connected through a common coupling resistor so as to function as a differential pair. The pair of transistors have inherent distortion in their amplitude transfer function (the latter term being defined as the ratio of the amplitude of the output signal over the amplitude of the input signal, both as a function of the input signal), due to the fact that their base-emitter junctions are nonlinear elements, especially near zero volts. Increasing the value of the cross-coupled resistor between the differential elements tends to improve linear behavior but decrease the gain of the amplifier. A second approach to improve the linear behavior of this multiplier is to increase the DC bias current through each differential element so as to increase the signal-to-distortion ratio of the output. This, however, increases the noise so as to lower the signal-to-noise ratio of the output.

Accordingly, a general object of the present invention is to provide an improved AM modulator which overcomes or substantially reduces the above-noted problems of the prior art.

Another, more specific object of the present invention is to provide an improved AM modulator of the type including a pair of differential elements.

And another object of the present invention is to provide an AM modulator having an improved signal-to-distortion ratio without sacrificing the signal-to-noise ratio.

Yet another object of the present invention is to provide an AM modulator having an improved linear transfer function without affecting the gain of the modulator.

These and other objects of the present invention are achieved by an improved "zero-distortion" modulator.

The improved modulator of the present invention comprises means for linearizing the nonlinear amplitude transfer function attributed by each of the differential elements of the modulator. The means includes two operational amplifiers each having an input coupled to a respective terminal of the Y input port of the modulator and an output coupled to the corresponding differential element of the modulator so that the resulting amplitude transfer function between the input of each operational amplifier and the output of the corresponding differential element is more linear than the amplitude transfer function of the differential element per se. As used herein the term "more linear" means that the standard error deviation of a plot of the input signal versus the output signal will be smaller when more linear.

Another aspect of the present invention is to provide an AM demodulator providing a substantially zero distortion demodulated output signal. For example, some demodulator schemes utilize operational amplifier technology. A common operational amplifier circuit which is widely used comprises a rectifying operational amplifier having its positive input grounded, while its negative input receives the input signal Ein, an AC signal, through an input resistor Rin. The output of the amplifier is connected to the anode of a rectifying diode which in turn has its cathode connected to the output of the demodulator. The output signal Eout (a DC signal) is provided across a load resistor Rl. The output of the demodulator is connected through feedback resistor Rf to its negative input. As is well known Eout=(Rf/Rin)·(Ein) when Ein<0 and Eout=0, when Ein>0; thereby providing rectification. This type of precision rectifier has been used, in principle, up to 200 KHz.

With modifications to the components and by AC coupling the topology, as is done for example, in the HP8901A modulation analyzer manufactured by Hewlett-Packard, the circuit can be expanded to be potentially used at frequencies in the range of 50 MHZ.

More particularly, the AC input, Ein, is applied through an AC coupling capacitor in series with resistor Rin to the negative input of a high frequency operational amplifier. The positive input of the amplifier is grounded. The output of the amplifier is AC coupled through a capacitor to the junction of the respective anode and cathode of two diodes. The corresponding cathode and anode of the two diodes form the respectively positive and negative outputs of the demodulator. The positive and negative outputs are each connected across load resistors Rl and are each connected back through a feedback resistor Rf to the negative input of the amplifier.

The latter circuit has the disadvantage that it must be closed-loop stable, i.e., no oscillations, at the carrier frequency of the input and at higher frequencies. Closed-loop stability is required because the diodes are each enclosed in a negative feedback loop in order to substantially eliminate the distortion contribution of the nonlinear behavior of each diode. Thus, closed-loop stability becomes a problem if performance is pushed very high in frequency, i.e. the carrier frequency.

Other circuit approaches involve large carrier drive levels which has disadvanges which are self-evident. Still other approaches to low distortion, or low level AM demodulation involve synchronous detectors, but synchronous detectors are not phase ignorant and do not behave exactly like an envelope detector. For example, if phase modulation, either desired or undesired, is present at the same time that amplitude modulation is present, the synchronous detector will attempt to react to both; whereas a true envelope detector is phase-ignorant and carrier frequency ignorant, which is a highly desirable feature assuming that only true envelope rectification is desired. Other methods of demodulation exist which involve "exalted carrier" technology; but these approaches generally add noise to the output signal.

Accordingly, it is another general object of the present invention to provide an improved demodulator which overcomes or substantially reduces the above-noted problems of the prior art.

Another more specific object of the present invention is to provide an improved demodulator providing a substantially undistorted demodulated output.

And another object of the present invention is to provide an improved demodulator, in which demodulation can be made over a substantially wide range of carrier frequencies without the need to heterodyne.

Yet another object of the present invention is to provide an improved demodulator requiring closed-loop stability in the vicinity of the modulation bandwidth rather than the carrier frequency range.

These and other objects of the present invention are achieved by an improved "zero-distortion" demodulator.

The improved demodulator of the present invention includes a first detector means for detecting an amplitude modulated signal. The first detector means is coupled to the first input of signal comparator means. Feedback is provided from the output of the signal comparator means back to its other input. Specifically, the output of the comparator means is coupled to the Y input port of a "zero distortion" modulator, preferably although not necessarily of the type made in accordance with the teachings of the present invention. The X input port of this modulator is adapted to receive a continous wave signal so that the output of the modulator is an undistorted AM modulated signal. The output of the modulator is coupled through a second detector which in turn is coupled to the second input of the comparator means so as to close the feedback loop. The first and second detectors are substantially matched for their nonlinear amplitude transfer functions so that the output signal of the signal comparator means is representative of a substantially undistorted form of the envelope component of the original AM modulated signal.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

For a fuller understanding of the nature and objects of the present invention reference should be had to the following detailed description taken in connection with the accompanying drawings wherein.

Figure 1:
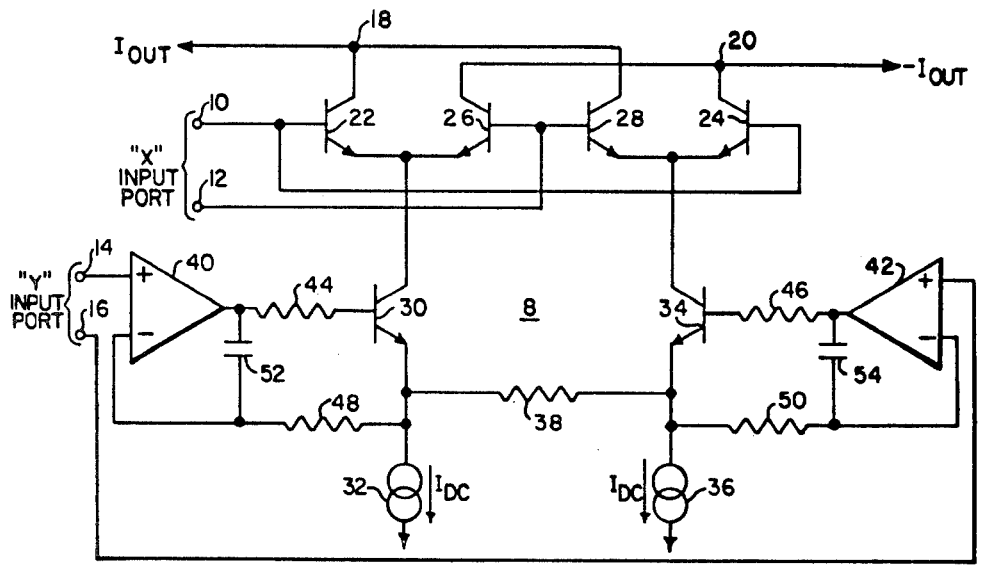
FIG. 1 is a preferred embodiment of the modulator of the present invention.

Referring to FIG. 1, the modulator 8 comprises a first pair of input terminals 10 and 12 so as to form the X input port and is adapted to receive the carrier signal, or "local oscillator input". The modulator also includes a second pair of input terminals 14 and 16 so as to form the "Y" input port, the latter functioning to receive the envelope signal or modulation input. The modulator is adapted to multiply the instantaneous amplitude of the signal appearing across terminals 10 and 12 with the instantaneous amplitude of the signal provided across terminals 14 and 16 so as to provide an output signal representative of the resulting multiplication product across the output terminals 18 and 20.

More particularly, terminal 10 of the X input port is connected to the bases of both transistors 22 and 24, while terminal 12 is connected to the bases of transistors 26 and 28. The collectors of transistors 22 and 28 are connected to the output terminal 18 while the collectors of transistors 24 and 26 are connected to the output terminal 20. The emitters of transistors 22 and 26 are tied together and are connected to the collector of transistor 30. The emitter of transistor 30 is adapted to be connected to a DC bias current source 32. Similarly, the emitters of transistors 24 and 28 are tied together and to the collector of transistor 34. The emitter of transistor 34 is adapted to be connected to the DC bias current source 36. Transistors 30 and 34 form a differential connected pair by coupling the emitters of transistors 30 and 34 through a common coupling resistor 38. By connecting input terminal 14 of the Y input port directly to the base of transistor 30 and input terminal 16 of the Y input port directly to the base of transistor 34 one obtains the configuration of the prior art four-quadrant multiplier described above. With such a configuration, it should be appreciated that transistors 30 and 34 have inherent distortion in their amplitude transfer functions due to the fact that their base emitter junctions are nonlinear resistive elements. The nonlinear base emitter junction resistance due to the presence of a signal across terminals 14 and 16 of the Y input port of the prior art configuration is directly connected to the respective bases of transistors 30 and 34 so that the resistance becomes a function of the signal applied to each of the bases. This signal dependent resistance appears in series with resistor 38, the latter being a linear resistor. If resistor 38 is made larger, a linearized behavior tends to result. However, for extremely low distortion, resistor 38 must be made so large that the gain of the prior art multiplier is unusually low. Raising the bias currents through the collector emitter paths of transistors 30 and 34 with sources 32 and 36 will reduce distortion, but noise will increase. Thus, in either approach, the signal-to-noise ratio of the multiplier decreases in order to gain a higher signal-to-distortion ratio.

In accordance with the present invention, the base-emitter junctions of transistors 30 and 34 are disposed in respective feedback paths of operational amplifiers 40 and 42 so as to linearize the effect of their otherwise nonlinear behavior. Specifically, operational amplifiers 40 and 42 are respectively coupled between the input terminals 14 and 16 of the Y input port and the differential elements formed by the transistors 30 and 34. By utilizing the operational amplifiers 40 and 42, resistor 38 can be independently set for the desired gain, the amplitude transfer function between the input of each amplifier 40 and 42 and the output of the emitter of the respective transistor 30 and 34 will be substantially linear, and distortion will be cancelled by virtue of amplifiers 40 and 42. In practice since the base emitter paths of transistors 30 and 34 are each in the feedback loop of an operational amplifier, stability issues are raised. Accordingly, means are preferably provided for stabilizing the feedback loop.

In particular a resistor 44 is connected between the output of amplifier 40 and the base of transistor 30. Similarly, resistor 46 is coupled between the output of amplifier 42 and the base of transistor 34. Resistors 44 and 46 each prevent localized oscillations with respect to the corresponding transistors 30 and 34. The emitter of transistor 30 is connected through resistor 48 to the negative input of operational amplifier 40. Similarly, the emitter of transistor 34 is connected through resistor 50 to the negative input of operational amplifier 42. The output of operational amplifier 40 is directly coupled to its negative input through roll-off capacitor 52. Similarly, the output of operational amplifier 42 is coupled through the roll-off capacitor 54 to its negative input. Resistor 48 and capacitor 52 are designed to have an amplitude roll-off at a frequency lower than that of the roll-off of transistor 30 so as to provide further stabilization of the feedback loop. Similarly, resistor 50 and capacitor 54 are designed to provide amplitude roll-off at a frequency lower than the roll-off provided by transistor 34 to stabilize the feedback loop of transistor 34.

The FIG. 1 embodiment was constructed utilizing the MC1496P chip as well as high quality chips for operational amplifiers 40 and 42. A 4.5 MHz carrier square wave approximately 1 volt peak-to-peak amplitude was applied to the X input port terminals 10 and 12. Resistor 38 was set at approximately 1.8 Kohms and the bias current $I_{DC}$ set by sources 32 and 36 was equal to approximately 3 milliamperes. A DC voltage of 1 volt was applied at terminal 14 and a 1KHz audio signal having a peak-to-peak amplitude of 2 volts was applied to terminal 16. This resulted in 1KHz side bands around a center frequency of 4.5 MHz, each 6db below the carrier (at 100% modulation) and 2KHz sidebands (distortion) around the 4.5MHz carrier that were down greater than 60db. The signal-to-noise ratio was better than 70db. Thus, the modulator provides for all practical purposes substantially zero distortion output.

Figure 2:
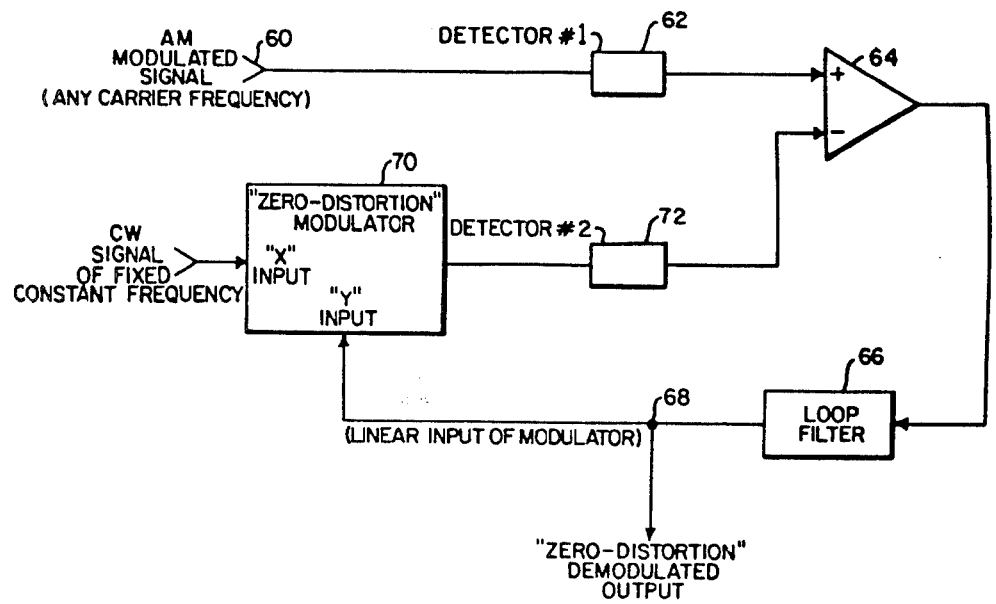
FIG. 2 is the preferred embodiment of the demodulator of the present invention.

Referring to FIG. 2, by using a zero distortion modulator, such as the one shown in FIG. 1, an improved demodulator can be provided. In particular a zero distortion modulator, such as the one shown in FIG. 1, is disposed in a feedback loop so that a zero distortion demodulated signal is provided.

More particularly, an AM modulated signal, at any select carrier frequency, is received at the input terminal 60. Input terminal 60 is connected to a detector 62 for detecting the AM modulated signal. Detector 62 can be any detector which is capable of selectively rectifying at least one half cycle of the AM modulated signal. For example, detector 62 can be in the form of a half-wave rectifier, such as shown in FIG. 3-16 (a) of Schwartz, Mischa; *Information Transmission, Modulation and Noise;* McGraw-Hill Book Company, New York (1959); p. 108, wherein the half-wave rectifier in its simplest form comprises a diode having its anode forming the input of the detector and the cathode of the diode forming the output of the detector. The output is provided across a load resistor connected between the cathode of the diode and system ground. As well known for carrier frequencies above about 10Mhz, the diode capacitance becomes significant and a small capacitor must be added, parallel with the load resistor, sized to remove frequencies in the range of the carrier and to follow the envelope of the AM modulated signal. The nature of detector 62 is such that it exhibits a nonlinear amplitude transfer function due to the nature of its component parts. In particular where a diode is used for rectification, the diode will in fact exhibit nonlinear behavior near the signal origin (zero amplitude).

The output of detector 62 is connected to the positive input of comparison means 64 for comparing the inputs at its positive and negative input terminals and for providing an output signal responsive thereto. Comparative means 64 preferably is in the form of an infinite gain operational amplifier. However, it should be appreciated that a finite gain amplifier can be used for the comparative means, particularly where better frequency response is desired. For example, a finite gain amplifier would be suitable where the carrier frequency and modulation rate are relatively high, e.g. a one gigahertz carrier frequency and a one megahertz modulation rate.

The output of comparative means 64 is connected to its negative input through a feedback path which includes a zero distortion modulator 70. Preferably, modulator 70 is of the type described with reference to FIG. 1, although other multiplier circuits can be used, such as a linear voltage controlled amplifier. Preferably, the output of comparative means 64 is connected through suitable means, such as a low pass filter 66, for providing smoothing of the signals as will be more apparent hereinafter. The output of filter 66 which preferably forms the output 68 of the demodulator is also connected to the Y input port of the zero distortion modulator 70. The X input port of modulator 70 is adapted to receive a continuous wave signal of a fixed constant frequency. As well known the constant frequency of the continuous wave signal should be at least twice the frequency or rate of the modulation envelope provided at the output of filter 66 in order to satisfy Nyquist criteria. The output of modulator 70 is in turn connected to second detector 72. The latter is designed to have an amplitude transfer function identical to the nonlinear amplitude transfer function of detector 62. The output of detector 72 is in turn connected to the negative input of comparative means 64 so that the negative input of comparative means 64 tends to track the positive input of the comparative means.

In operation, since the nonlinearity of the transfer function of detector 72 matches that of detector 62, and the negative input of comparative means 64 tracks its positive input, output 68 will provide a zero distortion demodulated output so long as modulator 70 provides zero distortion. Filter 66 can help remove frequencies in the range of the carrier of the AM modulated signal applied to terminal 60 so as to prevent unnecessary oscillations in the feedback loop. It will be appreciated that some smoothing can be provided by detector 62 and detector 72 and that some roll-off will be provided by comparative means 64.

Figure 3:
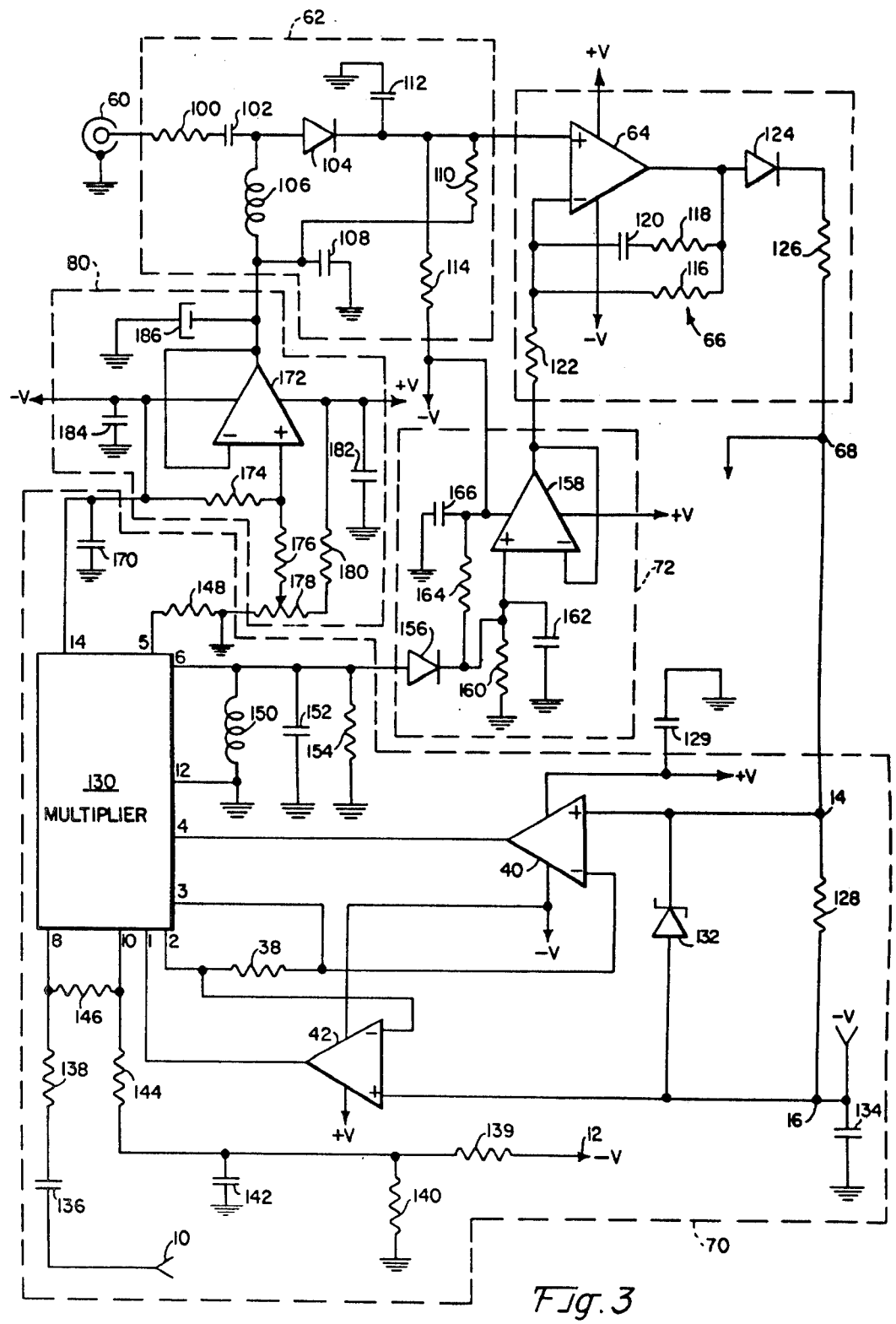
FIG. 3 is a detailed schematic of a specific implementation of the demodulator of FIG. 2.

Referring to FIG. 3, a preferred implementation of the FIG. 2 embodiment is shown. In particular, input 60 is connected to the detector 62, the latter comprising an input resistor 100, which is in turn connected through capacitor 102 to the anode of diode 104. The anode of diode 104 is also connected through inductor 106 to the detector bias supply 80, the latter being described hereinafter. Inductor 106 is also connected through capacitor 108 to system ground and through resistor 110 to the cathode of diode 104. The cathode of diode 104 is connected through capacitor 112 to system ground, through resistor 114 to receive a negative DC voltage and to the positive input of comparative means 64.

Comparative means 64 is suitably adapted to be biased by positive and negative DC voltages as well known in the art. Preferably, the filter 66 is provided by connecting the output of means 64 to its input through a first feedback loop formed by resistor 116 and a second feedback formed by resistor 118 connected in series with capacitor 120. Resistors 116, 118 and capacitor 120 together with the comparative means 64 function as an integrator with phase correction thereby performing the function of filter 66 of FIG. 2. The negative input of comparative means 64 is adapted to receive the output of detector 72 through the input resistor 122. The output of comparative means 64 is also connected to the anode of diode 124, the latter having its cathode connected through the output resistor 126. The output resistor 126 is connected to the output terminal 68 of the demodulator.

The output terminal 68 is connected directly to the Y input port terminal 14 and through biasing resistor 128 to the Y input port terminal 16. Input terminal 14 is connected to the positive input of amplifier 40 while terminal 16 is connected to the positive input of amplifier 42. Amplifiers 40 and 42, suitably adapted to be biased with negative and positive voltage sources and grounded through capacitor 129, have their negative inputs connected to one another through resistor 38. The outputs of operational amplifiers 40 and 42 are connected respectively to the 4 and 1 input pins of the MC1496P chip, indicated at 130 and described more generally with respect to FIG. 1.

In order to prevent the signal input to the Y input port terminals from going too high, so as to hit the rail voltages provided in the modulator which in turn would cause the output to detector 74 to decrease and result in positive feedback, means preferably in the form of Zener diode 132, is provided for clamping the voltage between terminals 14 and 16. Further, input terminal 16 is suitably adapted to be biased with a negative DC bias signal and similarly connected to ground through capacitor 134. The X input port terminal 10 which is adapted to receive the continuous wave signal of constant frequency, is AC coupled through capacitor 136 in series with resistor 138 to the number 8 input pin of the chip 130. The number 10 input pin of the chip 130 is suitably adapted to be biased by a negative DC voltage at the terminal 12 connected through the resistive divider formed by resistors 139 and 140 which in turn is connected to ground through capacitor 142. The resistive divider formed by resistors 139 and 140 is also connected through resistor 144 to the number 10 input of chip 130. A resistor 146 is connected between the number 8 and number 10 input pins of the chip. The number 5 pin of the chip 130 is suitably connected to ground through resistor 148.

The number 12 pin of the chip 130 is suitably connected to ground while the number 6 pin is connected to the ground through each of the inductor 150, capacitor 152 and the resistor 154 the latter three elements forming a bandpass filter. The number 6 pin is also connected to the detector 72. In particular pin 6 is connected to the anode of diode 156, the latter having its cathode connected to the buffer amplifier 158. The latter has its negative input connected to its output, its positive input connected through resistor 160 to ground and through capacitor 162 to ground. The cathode of the diode 156 is connected through resistor 164 to a negative DC bias source, the latter being suitably coupled to the ground through capacitor 166. The output of the buffer amplifier 158 is connected to the resistor 122 of the comparative means and filter means 64 and 66. The pin 14 of chip 130 is AC coupled to ground through capacitor 170 and is suitably connected to the detector bias supply 80. Detector bias supply 80, as will be seen hereinafter provides a biasing current through diodes 104 and 156 of the corresponding detectors 62 and 72 so as to insure that the operation of the demodulator will not occur about the origin at zero amplitude. Accordingly, detector bias supply 80 includes a buffer amplifier 172 having its positive input connected through resistor 174 to the pin 14 of chip 130. The positive input of buffer amplifier 172 is also connected through resistor 176, thence through a portion of potentiometer 178 to system ground. Resistor 176 is also connected through the remaining portion of the potentiometer 178, thence through series resistor 180 where it is adapted to be connected, to a suitable positive DC bias voltage supply. The latter together with a negative DC voltage supply are adapted to suitably bias amplifier 172, with each of the supplies suitably AC coupled to ground through the respective capacitors 182 and 184. The negative input of amplifier 172 is connected to the output of the amplifier which in turn is coupled through capacitor 186 to system ground and to the junction of conductor 106 and capacitor 108 of the detector 62.

It should be appreciated that while the elements 104, 124 and 156 are shown as diodes, other unidirectional current conduction means such as diode connected transistors can be utilized.

In operation the AM input is provided to the input terminal 60. In this regard the AM signal can be at any carrier frequency, for example, anywhere from 1 Mhz to 10 gigahertz, it being noted that such a signal can be provided without the need to heterodyne. Inductor 106 and capacitor 108 function preferably as an RF (radio-frequency) choke. The detector bias supply 80 inserts a bias current through diode 104. The level of the inserted current is large enough in order to insure that diode 124 will never turn off but small enough so that the diode 104 will not operate at a substantially different AC bias from diode 156. A signal bias level from 5 to 10 millivolts has been found to be satisfactory. By making resistor 114 equal to resistor 164, it should be appreciated that a suitable bias is provided on the two diodes 104 and 156 since operation about the zero point of each diode encounters infinite distortion when the diodes are reversed bias. The use of inductor 150, capacitor 152 and resistor 154 function as a bandpass filter and if set properly the DC input impedance of each of the diodes 104 and 156 can be set at zero at the modulating frequency and the transient response in the region of the modulation signal frequency band of the output of the diodes will be matched.

The circuit of FIG. 3 provides an improved demodulator since diode 124 is always forward biased and the input at terminal 14 will always be positive. Modulator 70 will thus always operate in only two quadrants i.e., the input at terminal 14 will always be of a positive polarity, insuring loop stability and true envelope demodulation. By matching impedances of the inputs and outputs of detectors 104 and 156, any transient responses of the two detectors will be matched. Since modulator 70 is a "zero distortion" modulator, the output at output terminal 68 will be an undistorted demodulation output.

The demodulator thus described generally in FIG. 2 and more specifically in FIG. 3 provides a simple and easy way of eliminating the distortion normally inherent in an AM modulator detector. The distortion is eliminated by utilizing a matching detector in a feedback loop containing a zero distortion multiplier such as the one described with respect to FIG. 1. The demodulator has a number of uses including but not limited to (1) use in a linear-scale RF voltmeter; (2) use as an AM demodulator that is frequency and phase ignorant with respect to the carrier; (3) use as a linear detector driving an optional log converter to replace the I.F. log amplifier used for a spectrum analyzer; (4) use in stereophonic AM broadcast reception with extremely low distortion AM component demodulation and insensitivity to frequency and phase modulation; (5) use in providing linearity verification for RF signal generator attenuators; (6) use in distortion verification of low-distortion sources of amplitude-modulated carriers; (7) use in low-level detection (of weak signals with improved linearity over the square-law case); (8) use in medical instrumentation; (9) use in high-fidelity audio AM receivers; (10) use in field strength meters; and (11) use in television AM demodulation.

Since certain changes may be made in the above apparatus without departing from the scope of the invention herein involved, it is intended that all matter contained in the above description and shown in the accompanying drawings shall be interpreted in an illustrative and not in a limiting sense.

What is claimed is:

1. An amplitude modulator comprising a first pair of terminals for receiving an input signal, a second pair of input terminals for receiving a carrier signal, signal multiplication means coupled to said first and second pairs of input terminals for multiplying said input signal with said carrier signal, and a pair of output terminals for providing a signal as a function of the multiplication product of the input signal and the carrier signal, said multiplication means comprising a pair of differential elements for measuring the difference in potential between the terminals of said first pair, each of said differential elements including an input and an output and exhibiting a nonlinear amplitude transfer function between the input and output, the inputs of said elements being respectively coupled to the input terminals of said first pair, wherein the improvement comprises:
means including a pair of operational amplifiers, each of said amplifiers including an inverting input, a non-inverting input and an output, said non-inverting input being coupled to a corresponding input terminal of the first pair and said output being coupled to the corresponding differential element and to said inverting input so that the amplitude transfer function between said non-inverting input of said operational amplifier and the output of the corresponding differential element is substantially linear.

2. A modulator according to claim 1, wherein each of said differential elements includes the base emitter junction of a transistor, said base emitter junction being disposed in a feedback path of the corresponding operational amplifier between said output and said inverting input of said corresponding operational amplifier.

3. A modulator according to claim 2, further including means for setting the gain of said modulator.

4. A modulator according to claim 3, wherein said means for setting said gain includes a resistor coupled between emitters of said corresponding transistors of said differential elements.

5. A modulator according to claim 2, further including means for stabilizing said feedback path of each said operational amplifier.

6. A modulator according to claim 5, further including a resistor coupled between the output of said operational amplifier and the base of the corresponding transistor of said differential elements.

7. A modulator according to claim 6, wherein said means for stabilizing said feedback path includes a second resistor coupled between the emitter of the corresponding transistor of said differential elements and said inverting input of said corresponding operational amplifier, and a capacitor coupled between the output and inverting input of each operational amplifier.

8. An amplitude modulator comprising:
a common-emitter diffential amplifier;
means for applying a carrier signal to said differential amplifier; and
means for applying a modulation signal to common emitters of said differential amplifier so that an amplitude modulated signal is provided at the output of said differential amplifier, said means for applying said modulation signal comprising an operational amplifier having one input coupled to receive a modulation input signal and the other input coupled to its output so as to form a feedback path for said operational amplifier, a transistor having its base-emitter junction connected in said feedback path and its collector coupled to said common-emitters for applying said modulation signal to said common emitters;
wherein the amplitude transfer function between said one input of said operational amplifier and said collector of said transistor is substantially linear.

9. A modulator according to claim 8, wherein said one input of said operational amplifier is the non-inverting input and said other input of said operational amplifier is the inverting input.

10. A modulator according to claim 9, further including means for stabilizing said feedback path of said operational amplifier.

11. A modulator according to claim 10, further including a resistor coupled between the output of said operational amplifier and the base of said transistor.

12. A modulator according to claim 11, wherein said means for stabilizing said feedback path includes a second resistor coupled between the emitter of said transistor and said inverting input of said operational amplifier, and a capacitor coupled between the output and inverting input of said operational amplifier.

* * * * *

UNITED STATES PATENT AND TRADEMARK OFFICE
CERTIFICATE OF CORRECTION

PATENT NO.   : 4,485,359
DATED        : November 27, 1984
INVENTOR(S)  : Daniel B. Talbot It is certified that error appears in the above-identified patent and that said Letters Patent is hereby corrected as shown below:

Claim 4, column 10, line 33, before "emitters", insert -- the --; and

Claim 8, column 10, line 50, delete "diffential" and substitute therefor -- differential --.

Signed and Sealed this

Twenty-third Day of April 1985

[SEAL]

Attest:

DONALD J. QUIGG

Attesting Officer     Acting Commissioner of Patents and Trademarks